(12) United States Patent
Sakui et al.

(10) Patent No.: US 7,362,614 B2
(45) Date of Patent: Apr. 22, 2008

(54) NON-VOLATILE SEMICONDUCTOR STORAGE APPARATUS (75) Inventors: Koji Sakui, Tokyo (JP); Kazuhiro Suzuki, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/529,272

(22) Filed: Sep. 29, 2006

(65) Prior Publication Data

US 2007/0086246 A1 Apr. 19, 2007

(30) Foreign Application Priority Data

Oct. 13, 2005 (JP) .......................... P2005-298946

(51) Int. Cl.
*G11C 11/34* (2006.01)
(52) U.S. Cl. .............................. 365/185.17; 365/185.21
(58) Field of Classification Search ........... 365/185.17, 365/185.21
See application file for complete search history.

(56) References Cited

U.S. PATENT DOCUMENTS 4,926,382 A * 5/1990 Sakui et al. ................. 365/203
5,453,955 A 9/1995 Sakui et al.
6,031,760 A * 2/2000 Sakui et al. ............ 365/185.21

OTHER PUBLICATIONS

K.-D. Suh et al., "A 3.3V 32 Mb NAND Flash Memory with Incremental Step Pulse Programming Scheme", IEEE Journal of Solid-State Circuits, vol. 30., No. 11, Nov. 1995.
Y. Iwata et al., "A 35ns Cycle Time 3.3 V Only 32 Mb NAND Flash EEPROM", IEEE Journal of Solid-State Circuits, vol. 30., No. 11, Nov. 1995.
J. F. Dickson, "On-chip high voltage generation in MNOS integrated circuits using an improved voltage multiplier technique", IEEE Journal of Solid-State Circuits, vol. SC-11., No. 3, Jun. 1976.
T.Hara et al., "A 146 mm$^2$ 8 Gb NAND Flash Memory In 70 nm CMOS," in ISSCC '05, Session 2.1, Feb. 2005.
D-S Byeon et al., "An 8 Gb Multi-Level NAND Flash Memory in a 63 nm CMOS Process," in ISSCC '05, Sessions 2.2 Feb. 2005.

* cited by examiner

*Primary Examiner*—Michael T Tran
(74) *Attorney, Agent, or Firm*—Rader Fishman & Grauer PLLC; Ronald P. Kananen (57) ABSTRACT

A non-volatile semiconductor storage apparatus includes a memory cell array including at least one memory cell unit in which multiple electrically rewritable non-volatile memory cells are serially connected, multiple control gate lines connecting to a control terminal for the multiple memory cells, a bit line connecting to the memory cell unit, means for selecting the control gate line, means for selecting the bit line, an externally input single power supply terminal, and an externally input ground potential terminal. In this case, the voltage equal to or lower than the voltage of the externally input single power supply is applied to the control gate line in reading out stored data in the memory cells.

3 Claims, 10 Drawing Sheets

|  | ERASE | READ | WRITE |
|---|---|---|---|
| SELECTED WL | 0 | 0 | Vpgm |
| UNSELECTED WL | 0 | Vread | Vpass |
| SSL | F | Vread | Vcc |
| GSL | F | Vread | 0 |
| "0" BL | F | 1.5 | 0 |
| "1" BL | F | 0.7 | Vcc |
| P-WELL | Verase | 0 | 0 |

FIG. 10A  BSEL

FIG. 10B  SS, S0, S2 ... S15, GS

FIG. 10C  SSL, WL0, WL2 ... WL15, GSL

NON-VOLATILE SEMICONDUCTOR STORAGE APPARATUS

CROSS REFERENCES TO RELATED APPLICATIONS

The present invention contains subject matter related to Japanese Patent Application JP 2005-298946 filed in the Japanese Patent Office on Oct. 13, 2005, the entire contents of which being incorporated herein by reference.

BACKGROUND OF THE INVENTION

1. Field of the Invention

The present invention relates to a non-volatile semiconductor storage apparatus such as a NAND flash memory.

2. Description of the Related Art

An electrically-rewritable flash memory has been known a semiconductor storage apparatus. Particularly, the high integration of a NAND flash memory including a NAND cell block having serially connected multiple cells is widely noticed.

One memory cell of the NAND flash memory has a FETMOS construction in which a floating gate (charge accumulating layer) and a control gate are stacked through an insulating film on a semiconductor substrate. A NAND cell unit includes multiple memory cells, the adjacent memory cells of which are serially connected by sharing the source and drain. The memory cell array includes NAND cell units arranged in a matrix.

The drains of the memory cells on one end of the NAND cell units aligned in the column direction of the memory cell array are commonly connected to a bit line through selected gate transistors, and the sources of the memory cells on the other end side are connected to a common source line through the selected gate transistors.

The word lines of the memory cell transistors and the gate electrodes of the selected gate transistors are commonly connected thereto as word lines (control gate lines) and selected gate lines in the direction of the row of the memory cell array.

The NAND flash memory has been disclosed by Non-Patent Documents 1 and 2 mentioned below, for example.

Non-Patent Document 1 describes an operation of a NAND flash memory, but the details will be described with reference to FIGS. 1 and 2.

Figure 1:
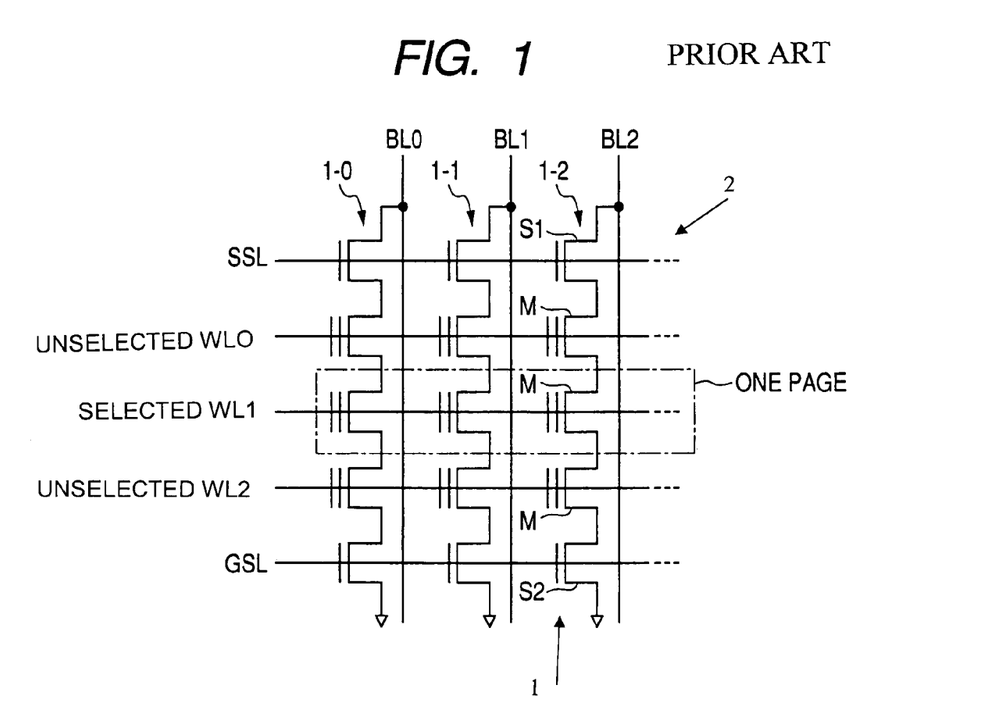
FIG. 1 is a circuit diagram showing a construction example of a memory array of a NAND flash memory.
Figure 2:
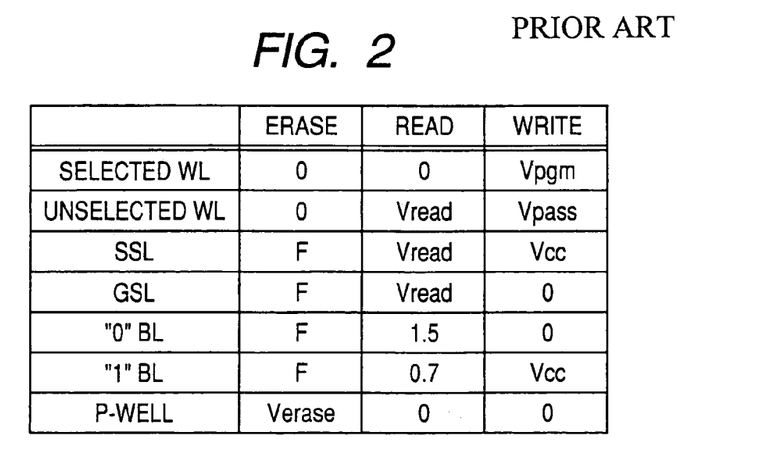
FIG. 2 is a diagram showing bias states for erasing, reading and writing operations on the NAND flash memory.

FIG. 1 is a circuit diagram showing a construction example of a memory cell array of a NAND flash memory. FIG. 2 is a diagram showing bias states of erasing, reading and writing operations on a NAND flash memory.

The NAND flash memory in FIG. 1 includes a memory cell array 2 having multiple memory cell units 1-0, 1-1, 1-2 and so on connecting to bit lines BL0, BL1, BL2 and so on and aligned in an array form.

The memory cell unit 1 (-0, -1, -2 and so on) has multiple (three in the example in FIG. 1) memory cells M connected in series between the selected gate transistors S and S2. The gate electrodes of the memory cells M are connected to word lines WL0, WL1 and WL2. The gate electrode of the selected gate transistor S1 is connected to a selected gate line SSL on the bit line side, and the gate electrode of the selected gate transistor S2 is connected to a selected gate line GSL on the source side.

FIG. 1 shows an example in which the word line WL1 is a selected word line, and the word lines WL0 and WL2 are unselected word lines.

Non-Patent Document 1: K.-D. Suh et al., "A 3.3V 32 Mb NAND Flash Memory with Incremental Step Pulse Programming Scheme," IEEE J. Solid-State Circuits, vol. 30, pp. 1149-1156, November 1995;

Non-Patent Document 2: Y. Iwata et al., "A 35 ns Cycle Time 3.3 V Only 32 Mb NAND Flash EEPROM," IEEE J. Solid-State Circuits, Vol. 30, pp. 1157-1164, November 1995; and Non-Patent Document 3: J. F. Dickson, "On-chip high-voltage generation in MNOS integrated circuits using an improved voltage multiplier technique," IEEE J. Solid-State Circuits, vol. SC-11, pp. 374-378, June 1976.

SUMMARY OF THE INVENTION

Disadvantages of the reduction of the power consumption in the NAND flash memory will be described below.

In recent years, demands for set equipment such as a silicon audio including a NAND flash memory have been rapidly increased.

In particular, a silicon audio among mobile music players is rapidly spreading among young people since the silicon audio is more compact and has lower power consumption than those of a CD and MD and one containing an HDD. For such mobile music players, an important differentiating technology is the time of continuous operation by a chargeable battery or a dry cell.

Particularly, many users perform operations of recording favorite music and/or erasing unnecessary music, that is, a rewriting operation on an NAND flash memory at home where an AC power supply is available without using a battery. Many users also use a battery to perform an operation of listening to favorite music, that is, an operation of reading out from a NAND flash memory for enjoyment of music outdoors.

Thus, in the reduction of the power consumption by a NAND flash memory, the reduction of power consumption by a read operation is more important to a set equipment designer than that of a rewrite operation.

On the other hand, Vread=4.5 V, which is a pass-voltage, is input to the selected gate lines SSL and GSL and the unselected word lines within the selected block in addition to that 0 V is applied to selected word lines within the selected block (NAND column) during a read operation on the NAND flash memory as described above. This is because 4.5 V may be required to input to unselected word lines in order to cause all of unselected cells to operate as pass-transistors since the upper limit of a threshold voltage distribution of memory cell transistors after writing is 4.5 V.

However, the current NAND flash memory has an externally input 3.3 V single power supply, and a NAND flash memory for a cellular phone has a 1.8 V single power supply.

Hence, 20 V, which may be required for writing, or 4.5 V, which may be required for reading, for example, is generated from the externally supplied voltage of 3.3 V by a booster circuit included in a NAND flash memory chip. Then, the booster circuit keeps working for generating 4.5 V or higher during a read operation.

Therefore, 16 mA or higher, which is about 80% of the average current of 20 mA for reading, is consumed by the booster circuit for reading. As a result, the power consumption for reading is a problem to a set equipment designer who considers that the reduction of power consumption for reading is more important than that for rewriting. Furthermore, the fact may be a large problem relating to the battery life, which is directly connecting to a technology that differentiates a product.

Notably, as the booster circuit, the circuit disclosed in Non-Patent Document 3 has been known, for example.

Accordingly, it is desirable to propose a non-volatile semiconductor storage apparatus, which can reduce power consumption for reading.

According to an embodiment of the invention, there is provided a non-volatile semiconductor storage apparatus including a memory cell array including at least one memory cell unit in which multiple electrically rewritable non-volatile memory cells are serially connected, multiple control gate lines connecting to a control terminal for the multiple memory cells, a bit line connecting to the memory cell unit, means for selecting the control gate line, means for selecting the bit line, an externally input single power supply terminal, and an externally input ground potential terminal, wherein the voltage equal to or lower than the voltage of the externally input single power supply is applied to the control gate line in reading out stored data in the memory cells.

According to another embodiment of the invention, there is provided a non-volatile semiconductor storage apparatus including a memory cell array including at least one memory cell unit in which multiple electrically rewritable non-volatile memory cells are serially connected, multiple control gate lines connecting to a control terminal for the multiple memory cells, a bit line connecting to the memory cell unit, means for selecting the control gate line, means for selecting the bit line, an externally input single power supply terminal, an externally input ground potential terminal, and a booster circuit which can output a voltage equal to or higher than the externally input single power supply voltage, wherein the booster circuit does not operate in reading out stored data in the memory cells.

According to another embodiment of the invention, there is provided a non-volatile semiconductor storage apparatus including a memory cell array including at least one memory cell unit in which multiple electrically rewritable non-volatile memory cell transistors are serially connected, multiple control gate lines connecting to a control terminal for the multiple memory cell transistors, a bit line connecting to the memory cell unit, means for selecting the control gate line, means for selecting the bit line, an externally input single power supply terminal, and an externally input ground potential terminal, wherein, when storage data of the memory cell transistors is defined by binary of logics "1" and "0", the threshold voltage of the memory cell transistors storing logic "1" is defined lower than the ground voltage while the threshold voltage of the memory cell transistors storing logic "0" is defined higher than the ground voltage and lower than externally input single power supply voltage.

In the non-volatile semiconductor storage apparatus, in accordance with an externally input command, the binary of logic "1" and logic "0", the quadrature of logic "11", logic "10", logic "01" and logic "00" or more logic values are preferably selectable for the stored data in the memory cell transistors.

Preferably, the non-volatile semiconductor storage apparatus further includes multiple driving voltage supply lines for supplying a driving voltage to the corresponding control gate line, and a transfer gate connecting the multiple driving voltage supply lines to the corresponding control gate lines in accordance with a select signal. In this case, the select signal is defined at the externally input single power supply voltage when a reading operation is started and is self-boosted when the driving voltage to be supplied to the driving voltage supply lines rises to the single power supply voltage.

In the non-volatile semiconductor storage apparatus, the reading form is preferably changeable based on a given mode signal.

According to the embodiments, the threshold voltage of a memory cell transistor storing logic "1" is defined lower than the ground voltage where stored data of the memory cell transistor is defined by binary of logics "1" and "0", for example. On the other hand, the threshold voltage of the memory cell transistor storing logic "0" is defined higher than the ground voltage and lower than externally input single power supply voltage. This allows the reading with voltage equal to or lower than externally supplied voltage and can reduce power consumption without operating a booster circuit in a read operation.

According to the embodiments of the invention, the power consumption for reading can be reduced.

DESCRIPTION OF THE PREFERRED EMBODIMENTS

With reference to drawings, embodiments of the invention will be described in detail below.

First Embodiment

Figure 3:
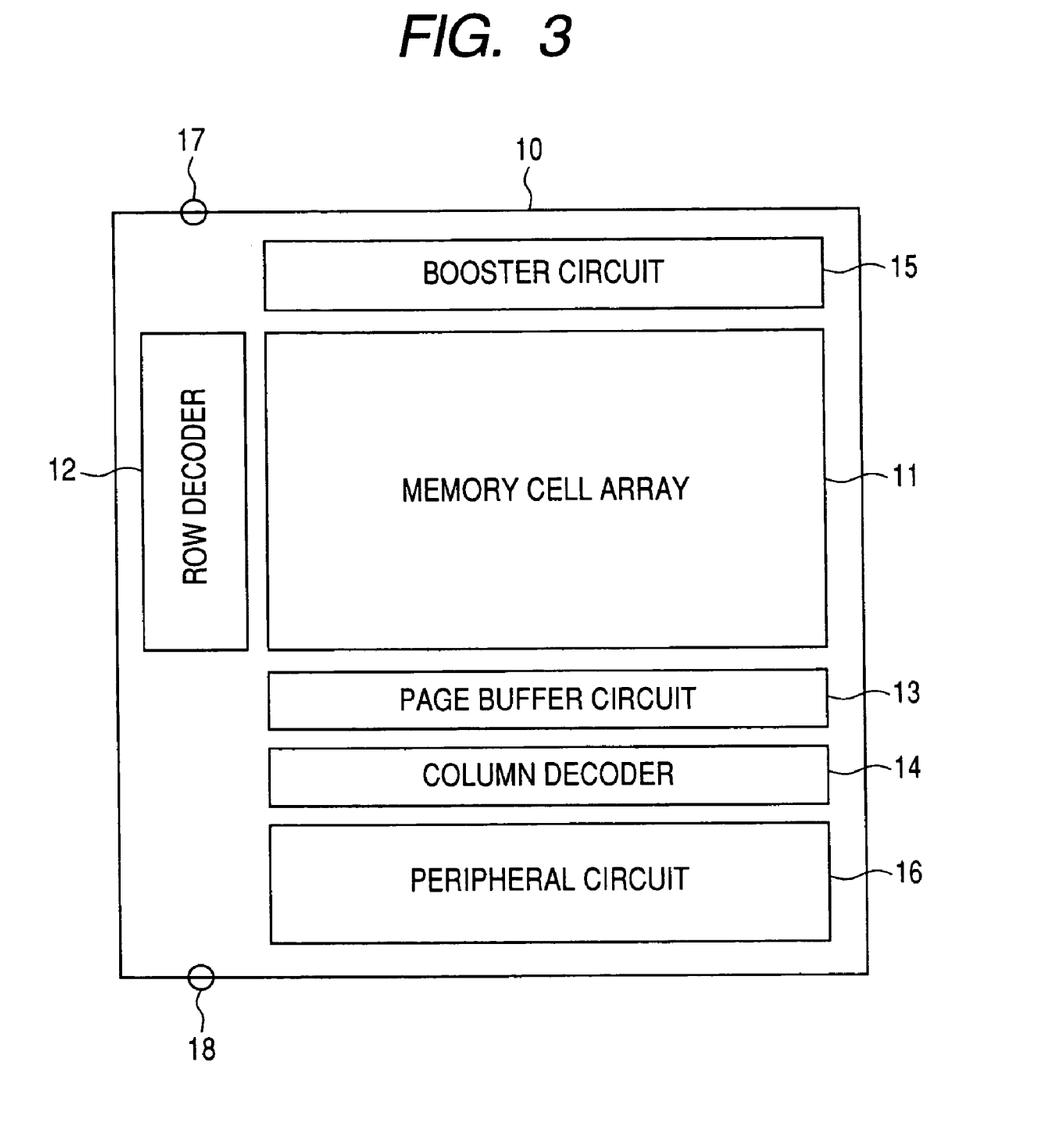
FIG. 3 is a block diagram of a NAND flash memory according to a first embodiment of the invention.

FIG. 3 is a block diagram of a NAND flash memory according to a first embodiment of the invention.

A NAND flash memory 10 has, as shown in FIG. 3, a memory cell array 11, a row decoder 12, a page buffer circuit 13, a column decoder 14, a booster circuit 15, and a peripheral circuit 16 such as a selector.

The NAND flash memory 10 has the row decoder 12 on one side of the memory cell array 11, the page buffer circuit 13 and column decoder 14 on the other side, and the booster circuit 15 and the peripheral circuit 16 around them. The flash memory chip includes an externally input single power supply terminal 17 and an externally input ground potential terminal 18.

Figure 4:
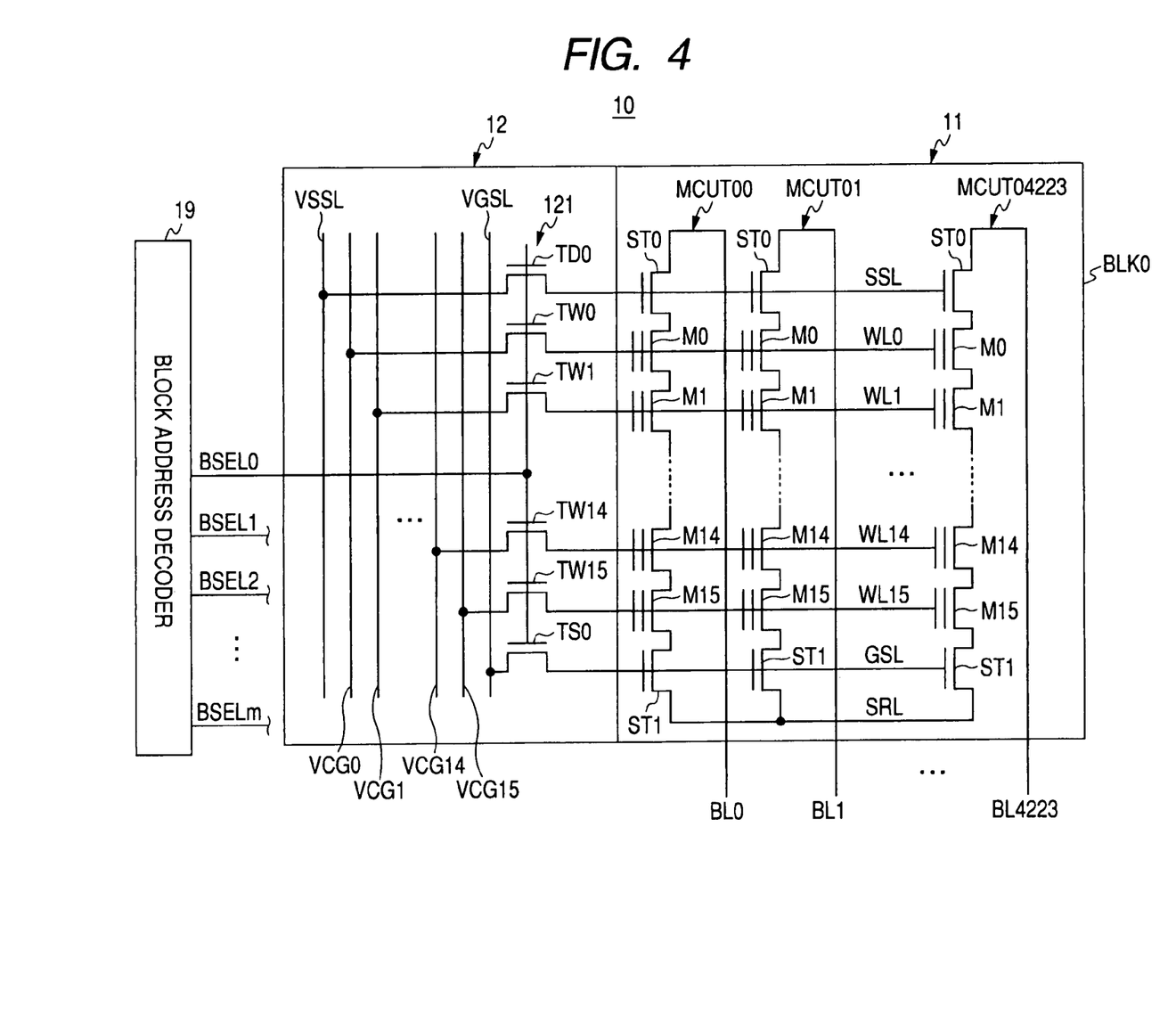
FIG. 4 is a diagram showing a memory cell array and row decoder in one block of the NAND flash memory according to the embodiment.

FIG. 4 is a diagram showing the memory cell array and row decoder in one block of the NAND flash memory according to this embodiment.

The memory cell array 11 has, as shown in FIG. 4, memory cell units MCUT00, MCUT01 and MCUT04223 in a matrix including multiple, such as sixteen, serially connected memory cell transistors M0 to M15 and two selected gate transistors ST0 and ST1 across them.

Though FIG. 4 only shows a row of block BLK0 having 1 row by 4224 columns of 4224 memory cell units MCUT00 to MCUT04223 for the simplification of the drawing, multiple (m) blocks BLK1 to BLKm each having the same construction as that of the block BLKD are further provided in reality.

In the example in FIG. 4, the number of bit lines is 528 bytes resulting from the addition of auxiliary 16 bytes to 512 bytes, that is, 4224 lines.

The memory cell transistor has an FETMOS structure in which a floating gate and a control gate are stacked.

The memory cell transistor is a rewritable memory cell by tunnel current.

The selected gate transistor ST0 connecting to the drain of the memory cell transistor M0 of the memory cell unit MCUT00 connects to the bit line BL0, and the drain of the memory cell transistor M0 of the memory cell unit MCUT01 connects to the bit line BL1. In the same manner, the drain of the memory cell transistor M0 of the memory cell unit MCUT04223 connects to the bit line BL4223.

The selected gate transistors ST1 connecting to the sources of the memory cell transistors M15 of the memory cell units MCUT00 to 04223 connect to a common source line SRL.

The gate electrodes of the memory cell transistors of the memory cell units MCUT00 and MCUT01 to MCUT04223 on the same row connect to common word lines WL0 to WL15. The gate electrode of the selected gate transistor ST0 connects to a common selected gate line SSL. The gate electrode of the selected gate transistor ST1 connects to the common selected gate line GSL.

The row decoder 12 has a transfer gate group 121 the continuity state of which is controlled by a block address decoder 19 and driving voltage supply lines VCG0 to VCG15, VSSL and VGSL for word lines and selected gate lines, which receive the supply from a word line decoder, not shown.

For simplification, FIG. 4 only shows a block address decoder section and a transfer gate group for the block BLK0. However, in reality, a block address decoder section and a transfer gate group are provided for each of multiple provided blocks, not shown.

The row decoder 12 has a function of selecting a word line (or control gate line), and a driving voltage equal to or lower than the power supply voltage Vcc, which is boosted or not boosted by the booster circuit 15 in accordance with an operation based on the address held in an address register, is supplied to driving voltage supply lines VCG0 to VCG15, VSSL and VGSL in accordance with the control signal indicating a reading (which may be called read), writing (which may be called write or program) or erasing (which may be called erase) operation.

The transfer gate group 121 includes transfer gates TW0 to TW15 and TD0 and TS0.

The transfer gate group 121 has a continuity state kept by a signal BSEL generated in response to the block address decoded by the block address decoder 19 for driving the selected gate line and word line of the corresponding block.

More specifically, when the block BLK0 is addressed, the transfer gates TW0 to TW15 operationally connect to the word lines WL0 to WL15 and driving voltage supply lines VCG0 to VCG15, respectively, in accordance with the output signal BSEL0 of the block address decoder 19. The transfer gates TD0 to TS0 also operationally connect to the selected gate lines SSL and GSL and driving voltage supply lines VSSL and VGSL in accordance with the output signal BSEL0 of the block address decoder 19.

The block address decoder 19 decodes the block address based on the address held in an address register, not shown, and, in response to the decoded block address, keeps the continuity state of the transfer gate group 121 for driving the selected gate lines and word lines of the corresponding block of the row decoder 12 by using the select signal (block select signal) BSEL.

The page buffer circuit 13 latches in pages read data from the memory cell array 11 or write data to the memory cell array 11.

The column decoder 14 has a function of selecting a bit line and may externally transfer the read data latched in the page buffer circuit 13 in accordance with a column control signal or may transfer write data to the page buffer circuit 13.

Figure 5:
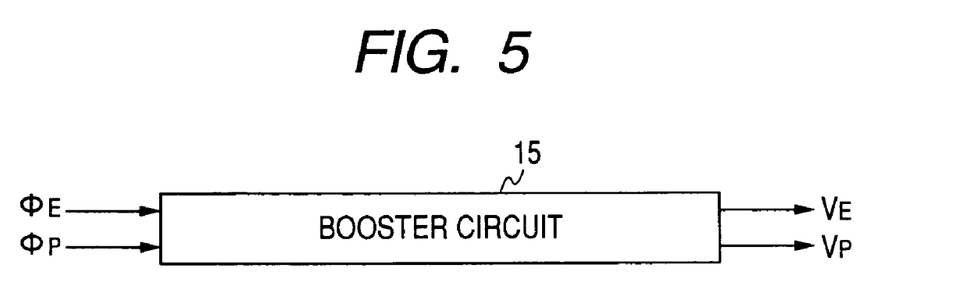
FIG. 5 is a diagram for describing a voltage to be boosted by a booster circuit according to the embodiment.

The booster circuit 15, as shown in FIG. 5, may receive the input of an erase signal $\Phi E$ in an erase operation or a program (write) signal $\Phi P$ in a program (write) operation and generate erase voltage VE or program (write) voltage, which is higher than the power supply voltage Vcc.

The booster circuit 15 according to the first embodiment does not include a booster system for a read operation. Thus, in a read operation, the voltage equal to or lower than the single power supply voltage Vcc supplied through the externally input single power supply terminal 17 and higher than the ground voltage is supplied to the driving voltage supply lines VCG0 to VCG15, VSSL and VGSL for the word lines and selected gate lines of the row decoder 12.

According to this embodiment, when the stored data in the memory cell transistor M of the memory cell array 11 is defined by binary of logic "1" and logic "0", the threshold voltage of the memory cell transistor storing logic "1" is defined lower than the ground voltage. On the other hand, the threshold voltage of the memory cell transistor M storing logic "0" is defined higher than the ground voltage and equal to or lower than the externally input single power supply voltage Vcc.

Figure 6:
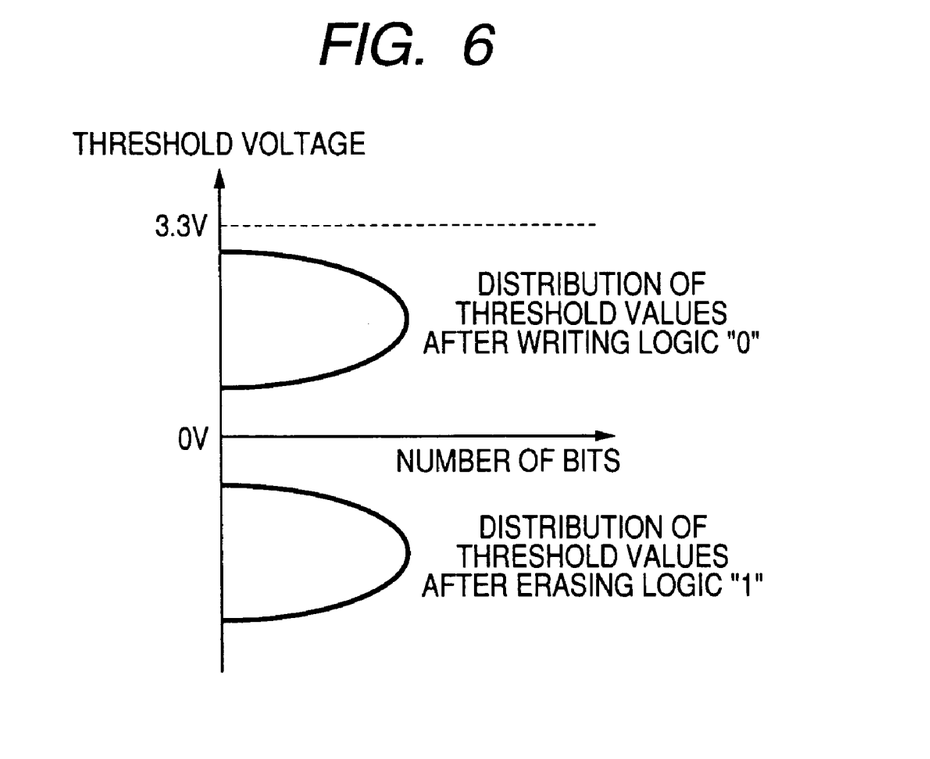
FIG. 6 is a diagram showing a distribution of threshold values of a memory cell transistor after writing to logic "0" and a distribution of threshold values of the memory cell transistor after erasing to logic "1"

FIG. 6 is a diagram showing a distribution of threshold values of a memory cell transistor after a write operation to logic "0" and a distribution of threshold values of a memory cell transistor after an erase operation to logic "1".

According to this embodiment, in the stored data of the memory cell transistor M, the threshold voltage Vth of the memory cell transistor storing logic "1" is defined lower than the ground voltage. On the other hand, the threshold voltage Vth of the memory cell transistor storing logic "0" is defined higher than the ground voltage and equal to or lower than the externally input single power supply voltage Vcc such as 3.3 V.

Figure 7:
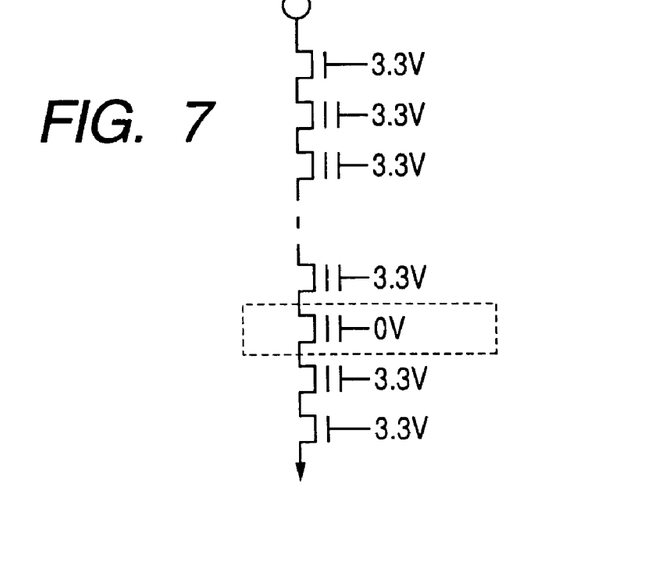
FIG. 7 is a diagram showing a voltage applied to a word line in a read operation according to the embodiment.

FIG. 7 is a diagram showing the applied voltages to word lines in a read operation according to this embodiment.

Except that 0 V is applied to the word line connecting to the selected memory cell, the externally input single power supply voltage 3.3 V or lower voltage is applied to all of the gates of the selected gate transistors on the bit line side and source line side and unselected word lines within the selected NAND cell unit.

Figure 8:
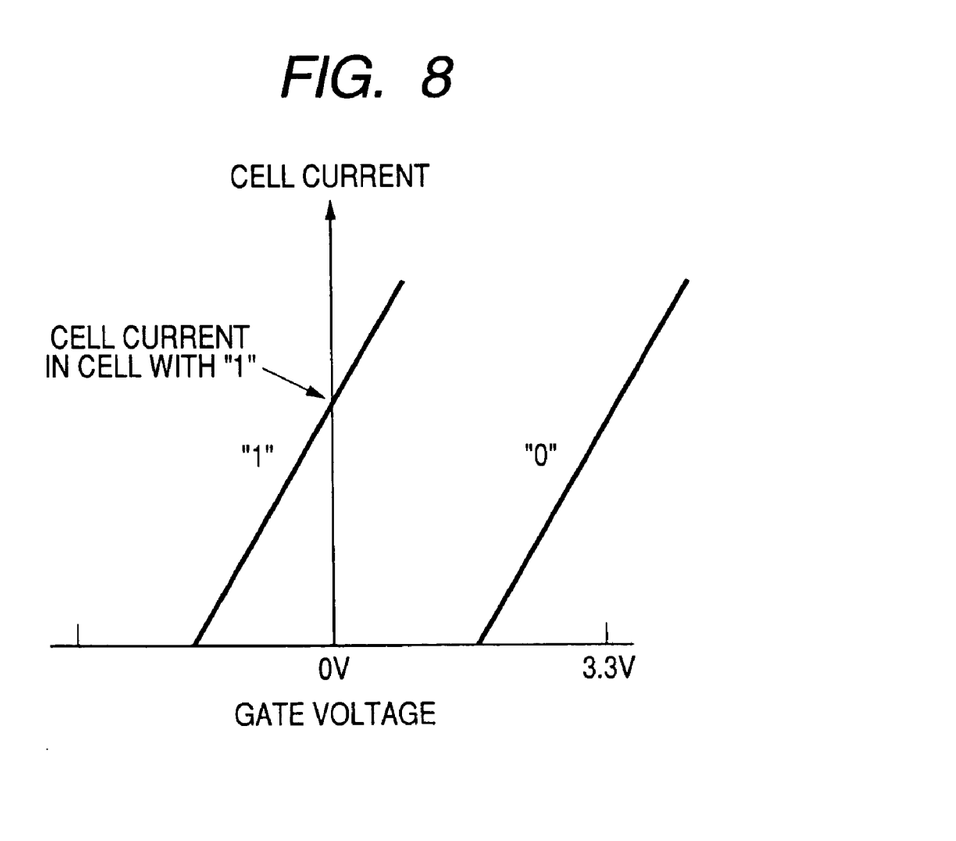
FIG. 8 is a diagram for describing cell current of a memory cell transistor.

Whether cell current is to be passed therethrough or not is determined based on the threshold voltage Vth of the selected memory cell transistor as shown in FIG. 8, and the determination on the stored data of logic "0" or logic "1" is made.

The threshold voltage Vth of the memory cell transistor storing logic "0" may be required to write higher than the ground voltage and lower than the externally input single power supply voltage 3.3 V. The technique therefor is identical to the writing technology on a multilevel NAND flash memory according to this embodiment.

In other words, the write cycle may be controlled in more detail to perform verify-reading after short writing by decreasing the step width ΔVpp of the write voltage to a word line in a writing operation. For example, the order of ΔVpp=0.5 V in binary writing may be decreased to ΔVpp=0.1 to 0.2 V.

The technologies related to a multilevel NAND flash memory are disclosed in Non-Patent Document 4 and Non-Patent Document 5 below:

Non-Patent Document 4: T. Hara et al., "A 146 mm² 8 Gb NAND Flash Memory in 70 nm CMOS," in ISSCC'05, Session2.1, February 2005; and Non-Patent Document 5: D-S. Byeon et al., "An 8 Gb Multi-level NAND Flash Memory in a 63 nm CMOS Process," in ISSCC'05, Session2.2, February 2005.

Figure 9:
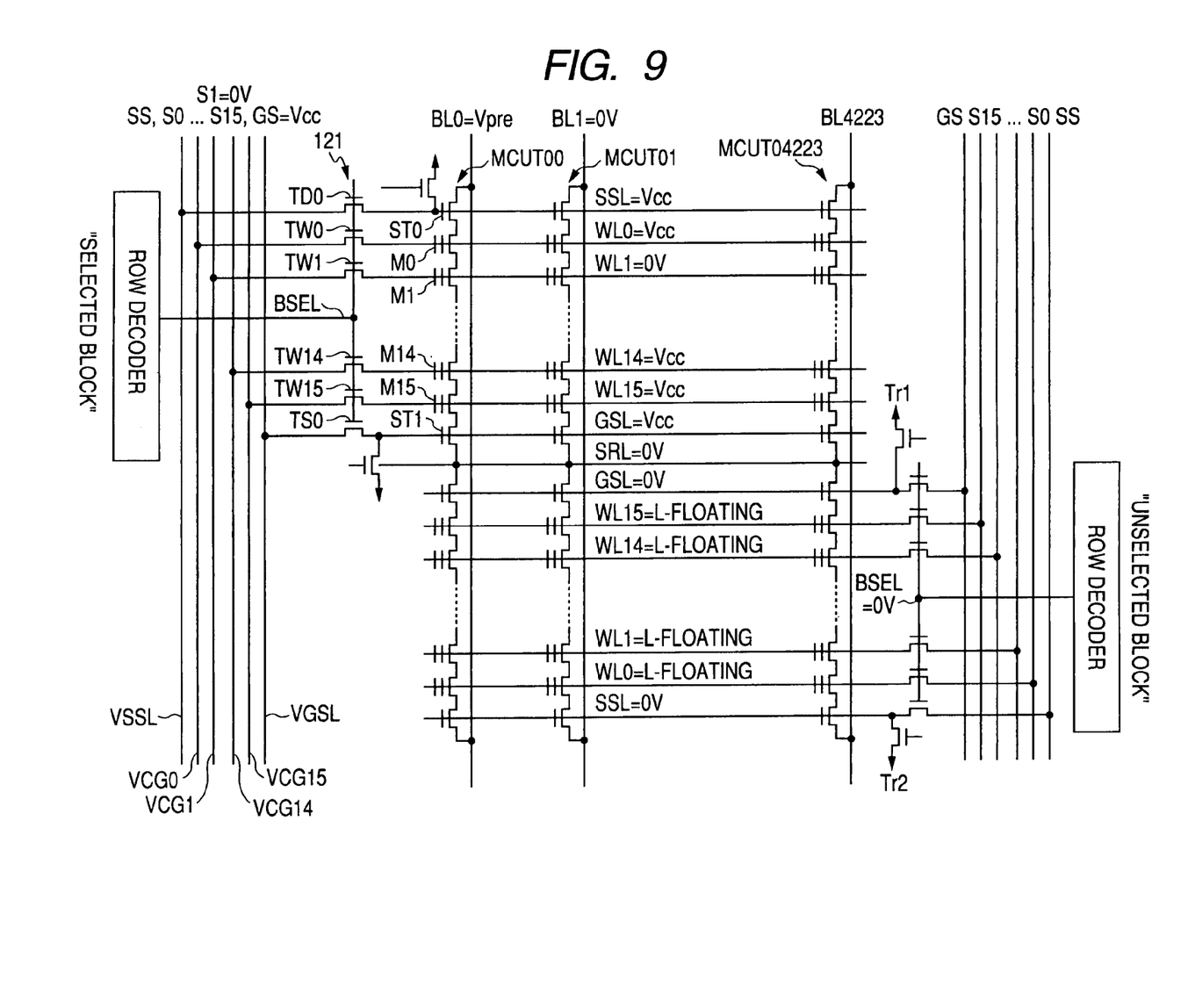
FIG. 9 is a diagram showing the cell array section and row decoder in the NAND flash memory corresponding to FIG. 4 and showing a bias condition for drive lines in data reading.
Figure 10A:
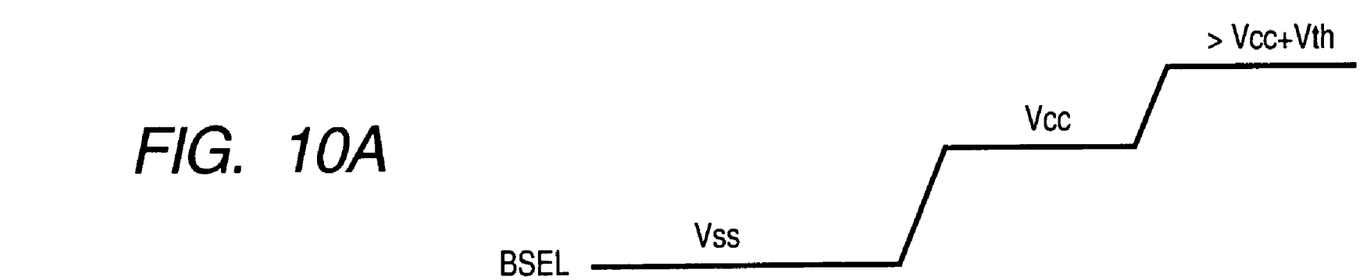
FIGS. 10A to 10D are timing charts for describing a read operation.
Figure 10B:
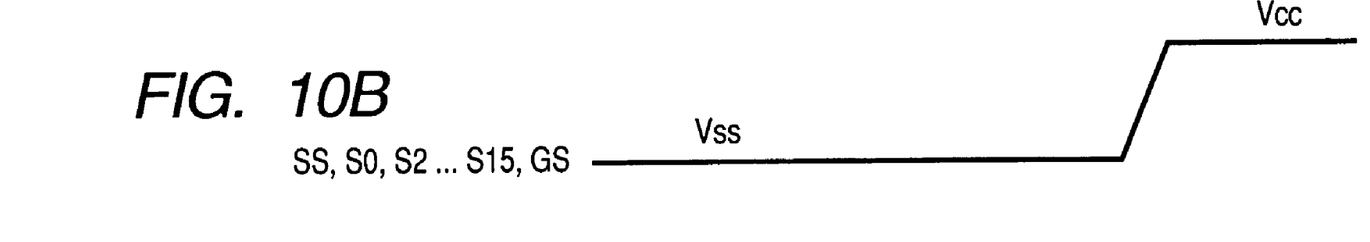
Figure 10C:
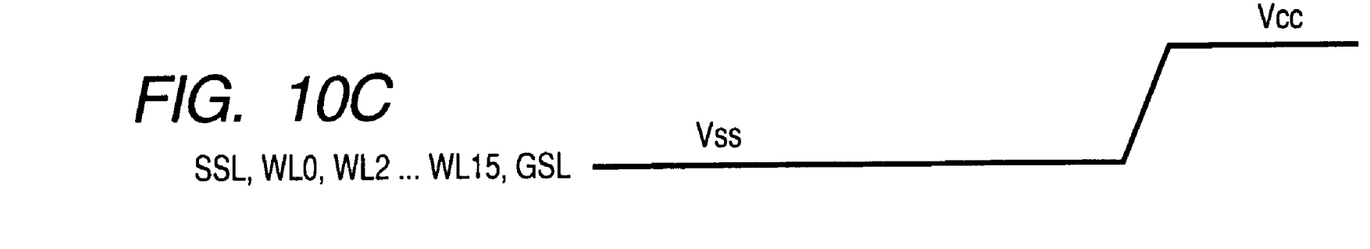
Figure 10D:
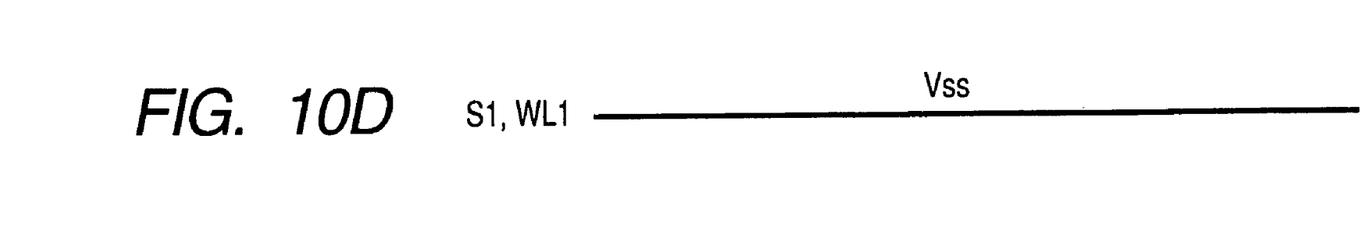

FIG. 9 is a diagram showing the cell array section and row decoder in the NAND flash memory corresponding to FIG. 4 and showing a bias condition for drive lines in data reading.

FIG. 9 shows a selected block and an unselected block.

In this example, a bit line shield technology is adopted for the bit line in a read operation where even-numbered and odd-numbered bit lines are read out alternately. The technology related to the bit line shield technology is disclosed in:

Patent Document 1: K. Sakui et al., "Non-volatile Semiconductor Memory Devices," in USP. 5,453,955, Sep. 25, 1995.

FIGS. 10A to 10D are timing charts for main nodes in a read operation in FIG. 9.

In the read operation, the ground voltage VSS=0 V may be input to the selected word line WL1 within the selected block BLK0, and the externally input single power supply voltage Vcc=3.3 V may be input to the other word lines WL0 and WL2 to WL15 within the selected block and the selected gate lines SS and GS connecting to the selected gate transistors ST0 and ST1 on the bit line side and source line side.

Thus, as shown in FIGS. 10A to 10D, the power supply voltage Vcc=3.3 V is first preliminarily charged when reading the block select signal BSEL for driving the word line transfer gates TW0 to TW15 is started.

Next, the word line select signals S0 and S2 to S15 to be applied to the driving voltage supply lines VCG0 and VCG2 to VCG15 and driving voltage supply lines VSSL and VGSL and select signals SS and GS for the selected gate transistors on the bit line side and source line side are raised from the ground voltage Vss=0 V to the power supply voltage Vcc=3.3 V. Thus, the intrinsic boot-strap causes BSEL>Vcc+Vth (=3.3 V+1 V), and the externally input single power supply voltage Vcc=3.3 V is supplied to the other word lines WL0 and WL2 to WL15 within the selected block and the selected gate lines SSL and GSL connecting to the selected gate transistors ST0 and ST1 on the bit line and source line sides. The ground voltage 0 V is supplied to the source line SRL.

Here, the threshold value Vth indicates threshold voltage for a word line transfer gate and may be equal to about 1V.

As described above in the NAND flash memory according to this embodiment, a read operation is performed without operating the booster circuit, which reduces the power consumption. However, the booster circuit defined herein does not include the intrinsic boot strap.

Therefore, when a user enjoys music outdoors by using a battery, for example, in set equipment such as a silicon audio including a NAND flash memory, that is, in a read operation from the NAND flash memory, the externally input single power supply voltage Vcc may be used without using a booster circuit. As a result, the battery life of the set equipment such as a silicon audio including a NAND flash memory can be extended.

The booster circuit 15 may be used without using a battery in set equipment such as a silicon audio including a NAND flash memory for operations for recording favorite music and/or erasing unnecessary music, that is, for a rewriting operation on the NAND flash memory since many users perform these operations at home where AC power supply is available.

According to this embodiment, data may be written in the memory cell transistor M1 of the memory cell unit MCUT00 (to MCUT04223) of the block BLK0 as follows.

Figure 11:
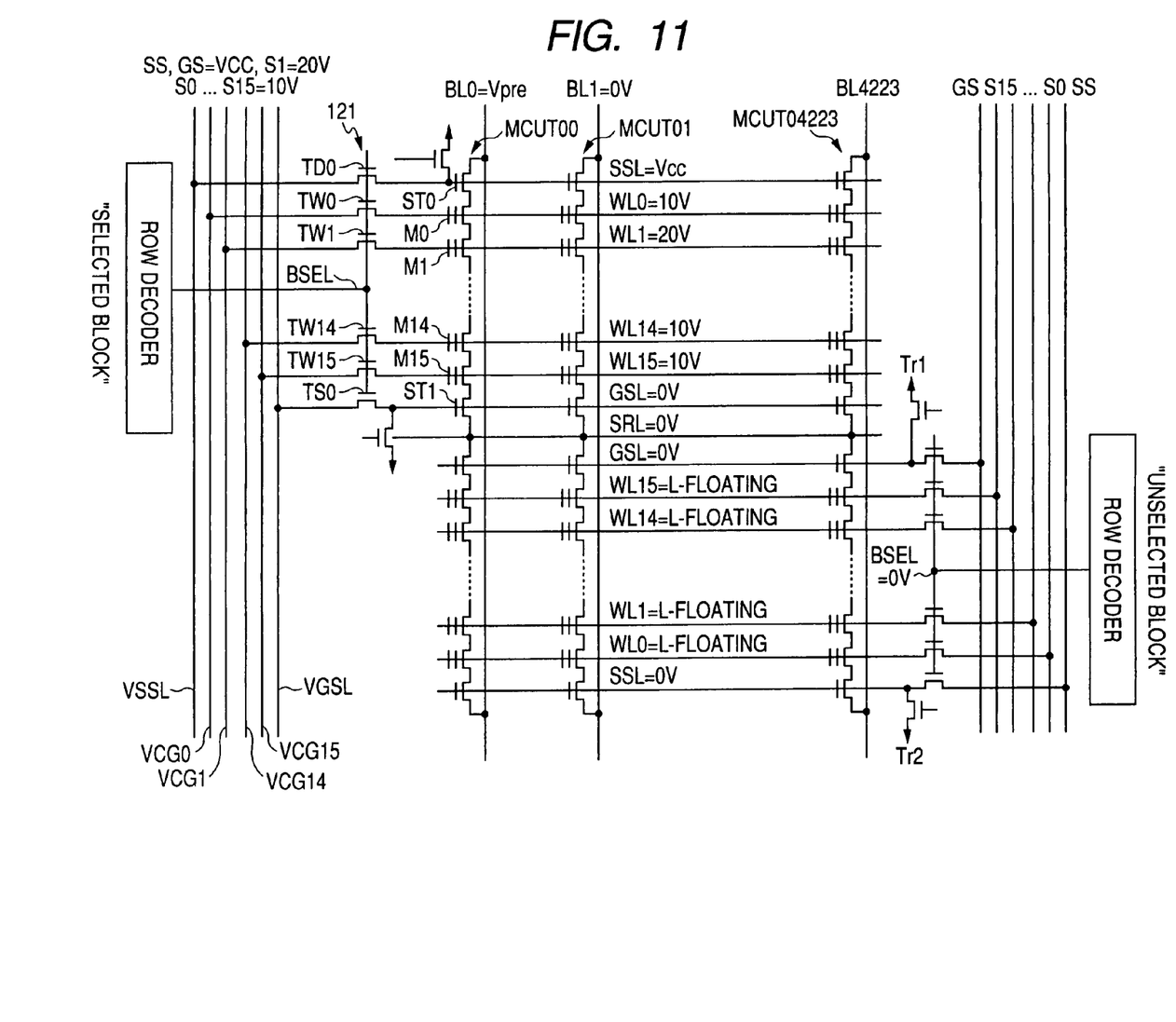
FIG. 11 is a diagram showing the cell array section and row decoder in the NAND flash memory corresponding to FIG. 4 and showing a bias condition for drive lines in data writing.

As shown in FIG. 11, in a write operation, the booster circuit 15 supplies a high voltage such as 20 V to the driving voltage supply line VCG1, a medium voltage (such as 10 V) to the driving voltage supply lines VCG0 and VCG2 to VCG15, a power supply voltage Vcc (such as 3.3 V) to the driving voltage supply line VSSL, and the ground voltage GND (0 V) to the driving voltage supply line VGSL.

The ground voltage GND is applied to the bit line BL0 connecting to the memory cell unit MCUT00 having the memory cell transistor M1 to undergo the write operation, and the power supply voltage Vcc is applied to the bit lines BL1 to BL04223 connecting to the memory cell units MCUT01 to MCUT04223 having the memory cell transistor M1 to inhibit the write operation.

Then, the output signal BSEL0 of the block address decoder 19 is only output to the part corresponding to the block BLK0 of the row decoder 12 at a level of 20 V+α. The output signals BSEL1 to BSELm of the block address decoders corresponding to the other blocks BLK1 to BLKm are output at the level of the ground voltage GND.

Thus, the transfer gates TW0 to TW15, TD0 and TS0 of the transfer gate group 121 corresponding to the block BLK0 are brought into conduction, and the transfer gates of the transfer gate group corresponding to the other blocks BLK1 to BLKm are kept out of conduction.

As a result, the write voltage of 20 V is applied to the selected word line WL1, and a pass voltage (medium voltage) Vpass (such as 10 V) is applied to the unselected word lines WL0 and WL2 to WL15.

Thus, the selected gate transistor ST0 of the memory cell units MCUT01 to MCUT04223 is forced to cutoff, and the channel parts of the memory cell units MCUT01 to MCUT04223 connecting to the memory cell transistor to inhibit the write operation are forced to float. Therefore, the potential of the channel parts is boosted mainly by the capacitor coupling with the pass voltage Vpass to be applied to the unselected word line and increases to the write-inhibiting voltage. As a result, the data writing to the memory cell transistor M1 of the memory cell units MCUT01 to MCUT04223 is inhibited.

On the other hand, the channel part of the memory cell unit MCUT00 connecting to the memory cell transistor to undergo a write operation is defined at the ground voltage VSS (0 V), and data writing is performed on the memory cell transistor M1 by the potential difference from the write voltage 20 V applied to the selected word line WL1. As a result, the threshold voltage is shifted to the positive direction from −3 V at the erase state to about 2 V, for example.

As described above, according to the first embodiment, the current consumption may be reduced from 20 mA, which may be originally required as average current, to 4 mA, which is about ⅕, without requiring operating the booster circuit in a read operation on the NAND flash memory. As a result, the battery life for read operations may extend significantly to five times, which can be apparently a differentiating technology to set equipment designers and can suppress the power consumption to end users, which can save the global energy resources.

Second Embodiment

Figure 12:
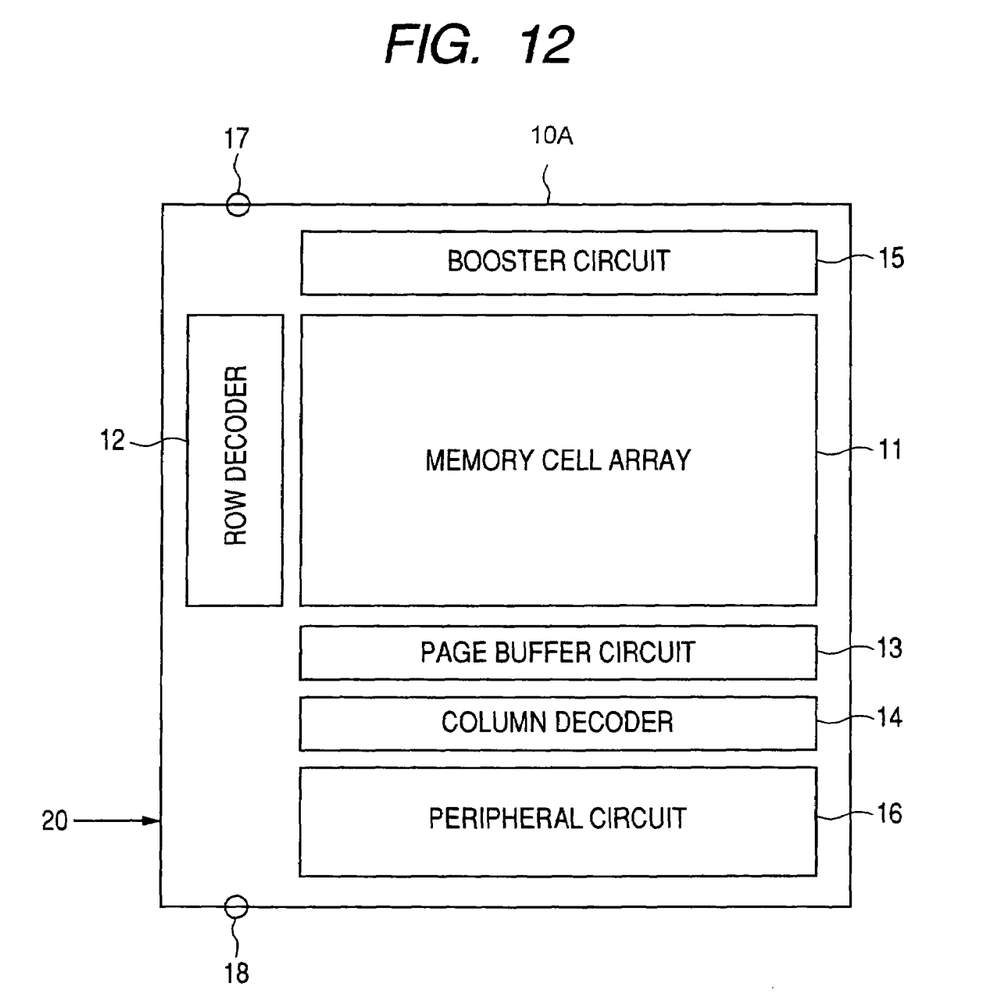
FIG. 12 is a block diagram of a NAND flash memory according to a second embodiment of the invention.

FIG. 12 is a block diagram of a NAND flash memory according to a second embodiment of the invention.

A NAND flash memory 10A of the second embodiment is different from the NAND flash memory 10 of the first embodiment in that, in response to the input of and in accordance with the value of an externally input command 20, the binary of logic "1" and logic "0", at least the quadrature of logic "11", logic "10", logic "01" and logic "00" or more logic values are selectable for the stored data in a memory cell transistor.

For example, if predetermined one bit of the externally input command 20 is "0", the stored data may be binary data. If "1", the stored data may be multilevel data.

Figure 13:
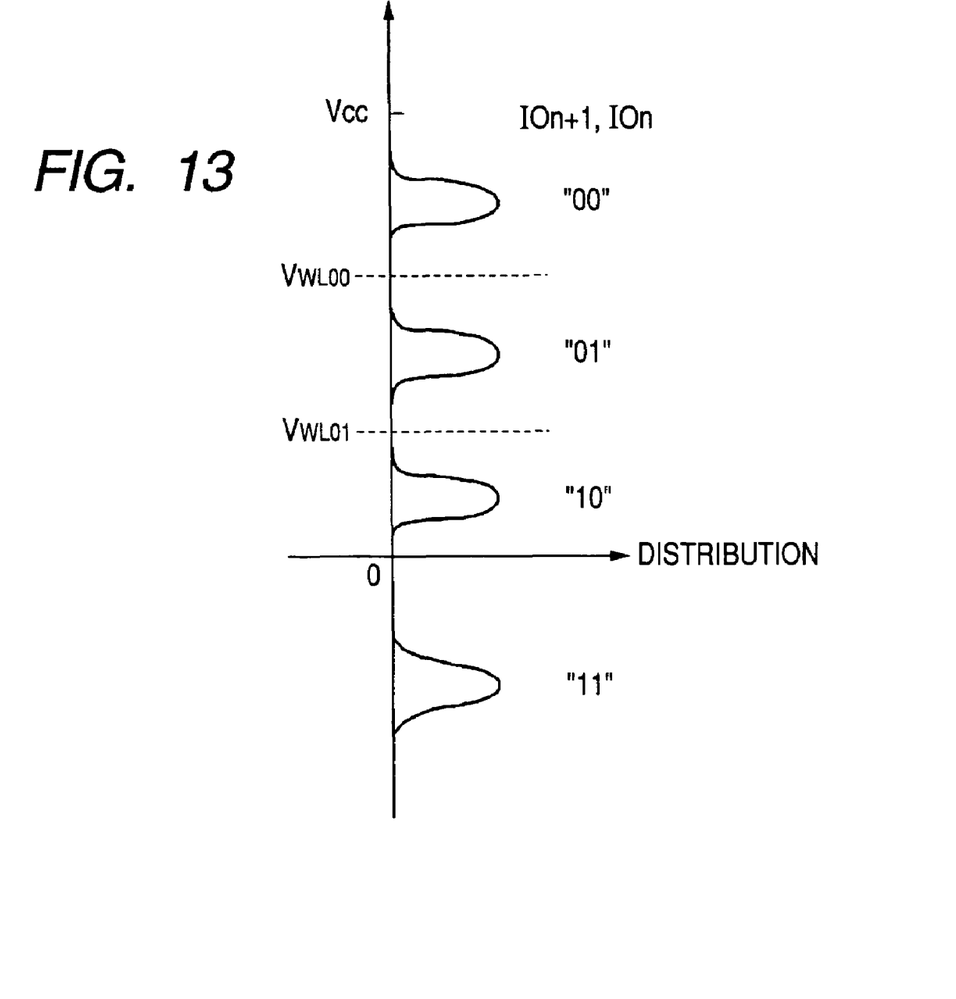
FIG. 13 is a diagram showing a relationship between a threshold voltage Vth level and data contents where 2-bits of quadrature data are recorded in one memory transistor in a NAND flash memory.

FIG. 13 is a diagram showing a relationship between a threshold voltage Vth level and data contents where 2-bits of quadrature data are recorded in one memory transistor in a NAND flash memory.

In FIG. 13, the vertical and horizontal axes indicate the threshold voltage Vth of the memory transistor and a frequency distribution of the memory transistor, respectively.

The contents of 2 bit data included in the data to record in one memory transistor is expressed by $[IO_{n+1}, IO_n]$ and takes four states of $[IO_{n+1}, IO_n]$=[1,1], [1,0], [0,1] and [0,0]. In other words, four states exist including data "0 (logic 00)", data "1 (logic 01)", data "2 (logic 10)" and data "3 (logic 11)".

The quadrature data of 2 bits may be recorded in one memory transistor as follows, for example.

In order to handle quadrature data, two latch circuits Q1 and Q2 may be provided in a page buffer circuit 13A.

The quadrature data is written by three steps, and each step moves to the next step when it is determined that all of cells to write in pages are written fully.

The data stored in the latch circuit Q1 is first written, and the data in the latch circuit Q2 is next written. Finally, the data in the latch circuit Q1 again is written.

If the write data is (Q2,Q1)=(1,0) here, "0" is inverted to "1" when the latch circuit Q1 is written fully. However, if (Q2,Q1)=(0,0), "0" is not (may not) inverted to "1" even when the latch circuit Q1 is written fully at the first step since the latch circuit Q1 is also used as write data at the third step.

The determination of the end of the write operation at each step is made when focused latch data (Q2 or Q1) is all inverted to "1".

The end determination is not performed on the cell with the write data (Q2,Q1)=(0,0) since the inversion of the latch circuit Q1 does not occur at the first step.

Next, a read operation will be described.

First of all, the latch circuits Q1 and Q2 are cleared.

Next, a read operation is performed by handling the word line voltage as VWL00 (such as 2.4 V). The cell current does not flow if the threshold voltage Vth is higher than the word line voltage (2.4 V). Thus, the bit line voltage holds a precharge voltage, and HIGH is sensed. On the other hand, if the threshold voltage Vth is lower than the word line voltage (2.4 V), the cell current flows, which drops the bit line voltage, and LOW is sensed.

Next, a read operation is performed with the word line voltage VWL01 (such as 1.2 V), and then finally a read operation is performed with the word line voltage of 0V.

According to the second embodiment, the read mode for binary storage data has a binary fast mode and a binary power-down mode.

Figure 14:
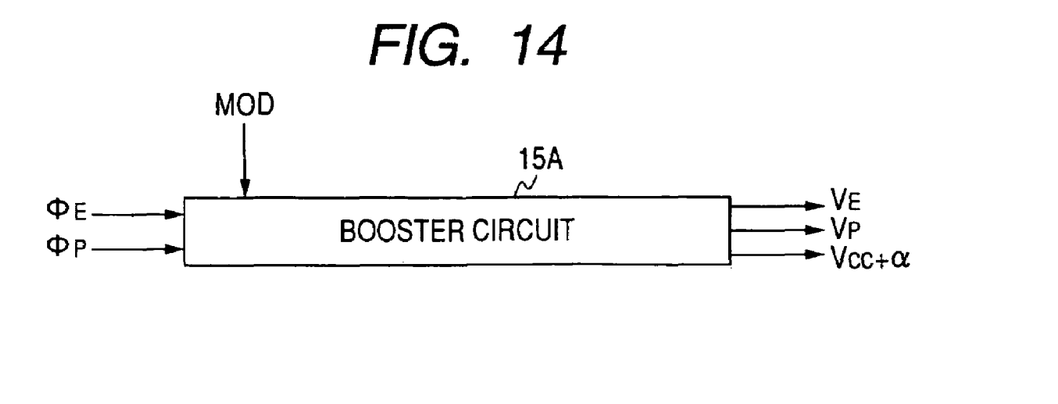
FIG. 14 is a diagram showing a booster circuit to which a mode signal is input according to the second embodiment.

Thus, a booster circuit 15A according to the second embodiment includes a read booster circuit, and a mode signal MOD is input to the booster circuit 15A as shown in FIG. 14.

The binary power down mode is, as in the first embodiment, effective when a user enjoys music outdoors by using a battery in a set equipment such as a silicon audio including a NAND flash memory.

The binary fast mode is effective when a user plays music at home where AC power supply is available, for example, without using a battery. Notably, the binary fast mode is selectable in a play operation using a battery.

For example, a mode signal MOD may include 2 bits. Then, if the two bits are "00", the "binary power-down mode" may be recognized. If "01", "the binary fast mode" may be recognized. If "10", the "multilevel mode" may be recognized.

In the "binary power-down mode, the block select signal BSEL is set at Vcc, and the block select signal BSEL becomes equal to or higher than Vcc+Vth (3.3 V+1 V) by the intrinsic boot strap when the select signal rises from VSS=0 V to the power supply voltage Vcc (3.3 V) at the next step.

Having described the construction with the threshold value for writing being equal to Vcc-Vth and the word line voltage being equal to Vcc in this case, the threshold value for writing may be equal to about Vcc, and the word line voltage may be equal to 2Vcc-Vth by boot strap. The use of the boot strap function may implement more secure reading.

Since the read operations in the "binary power-down mode" and "multilevel mode" have been already described, the repetitive description on each of them will be omitted here.

In a read operation on a NAND flash memory in the "binary fast mode", 0 V is applied to a selected word line within a selected block while Vread=3.3 V, which is a pass voltage, is applied to the other selected gate lines SSL and GSL and unselected word lines within the selected block.

Then, in the "binary fast mode" according to this embodiment, the block select signal BSEL is boosted and output by the booster circuit 15A to Vcc+Vth (3.3 V+1 V) or higher. Thus, the Vread=3.3V, which is apass voltage (select signal), is output to the selected gate lines SSL and GSL and unselected word lines within the selected blocks in parallel with the block select signal BSEL. Therefore, faster reading can be achieved than the "binary power-down mode".

In this case, since the read operation includes a boosting operation, the power consumption is slightly increased more than that of the "binary power-down mode". However, the increase is only the order of the threshold voltage Vth (1 V) of the MOS transistor of a transfer gate, and the range to be boosted is smaller than the original 4.5 V. As a result, the influence of the battery consumption can be minimized.

The second embodiment can provide the same effect as that of the first embodiment.

That is, the current consumption may be reduced from 20 mA, which may be originally required as average current, to 4 mA, which is about ⅕, without requiring operating the booster circuit in a read operation on the NAND flash memory. As a result, the battery life for read operations may extend significantly to five times, which can be apparently a differentiating technology to set equipment designers and can suppress the power consumption to end users, which can save the global energy resources.

Furthermore, according to the second embodiment, a recording form can be selected as a multilevel value such as binary and quadrature values based on an external command and may therefore be selectable arbitrarily in accordance with the size of data to be recorded.

Furthermore, the multilevel mode, "binary power-down mode" or "binary fast mode" may be selected arbitrarily as a read mode, which is effective in consideration of the remaining amount of a battery or for the outdoor use or indoor use such as use at home.

It should be understood by those skilled in the art that various modifications, combinations, sub-combinations and alterations may occur depending on design requirements and other factors insofar as they are within the scope of the appended claims or the equivalents thereof.

What is claimed is:

1. A non-volatile semiconductor storage apparatus comprising:

a memory cell array including at least one memory cell unit in which multiple electrically rewritable non-volatile memory cell transistors are serially connected;

multiple control gate lines connecting to a control terminal for the multiple memory cells;

a bit line connecting to the memory cell unit;

means for selecting the control gate line;

means for selecting the bit line;

an externally input single power supply terminal; and an externally input ground potential terminal, wherein, when stored data of the memory cell transistors is defined by binary of logics "1" and "0", the threshold voltage of the memory cell transistors storing logic "1" is defined lower than the ground voltage while the threshold voltage of the memory cell transistors storing logic "0" is defined higher than the ground voltage and lower than externally input single power supply voltage, wherein, in accordance with an externally input command, the binary of logic "1" and logic "0", the quadrature of logic "11", logic "10", logic "01" and logic "00" or more logic values are selectable for the stored data in the memory cell transistors and further comprising:

multiple driving voltage supply lines for supplying a driving voltage to the corresponding control gate line; and a transfer gate connecting the multiple driving voltage supply lines to the corresponding control gate line in accordance with a select signal, wherein the select signal is defined at the externally input single power supply voltage when a reading operation is started and is self-boosted when the driving voltage to be supplied to the driving voltage supply lines rises to the single power supply voltage.

2. The non-volatile semiconductor storage apparatus according to claim 1, wherein the reading form is changeable based on a given mode signal.

3. The non-volatile semiconductor storage apparatus according to claim 1, wherein the reading form is changeable based on a given mode signal.

* * * * *